United States Patent [19]

Cometta

[11] 4,182,024
[45] Jan. 8, 1980

[54] AUTOMATIC CONTROL OF INTEGRATED CIRCUIT TRIMMING

[75] Inventor: Robert A. Cometta, San Jose, Calif.

[73] Assignee: National Semiconductor Corporation, Santa Clara, Calif.

[21] Appl. No.: 860,927

[22] Filed: Dec. 15, 1977

[51] Int. Cl.² ............................................. B01J 17/00
[52] U.S. Cl. ........................................ 29/571; 29/574; 29/577 R; 29/584
[58] Field of Search ....................... 29/571, 577, 576 B, 29/584, 574

[56] References Cited

U.S. PATENT DOCUMENTS

| | | | |
|---|---|---|---|
| 3,581,385 | 6/1971 | Lathrop | 29/577 |
| 3,688,389 | 9/1972 | Nakanuma | 29/584 |

OTHER PUBLICATIONS

Solid State Technology, May 1969, "Laser Adjustable Resistors for Precision Mono, Circuits, by Braun & Breuer, pp. 56-62.
Industrial Lasers & Their Applications, 1974, Harry, McGraw-Hill, pp. 136-138.

Primary Examiner—W. C. Tupman
Attorney, Agent, or Firm—Gail W. Woodward

[57] ABSTRACT

In a monolithic integrated circuit having a combination of bipolar and junction field effect transistors, a pulsed laser is employed to trim the transistors to achieve balanced circuit performance. The laser is applied to individual circuits in wafer form using a step and repeat operation. Each circuit is measured, the transistor to be trimmed determined and a first trim performed. The circuit is remeasured and, if still out of specification, retrimmed. The process is repeated until a desired degree of balance is achieved.

9 Claims, 3 Drawing Figures

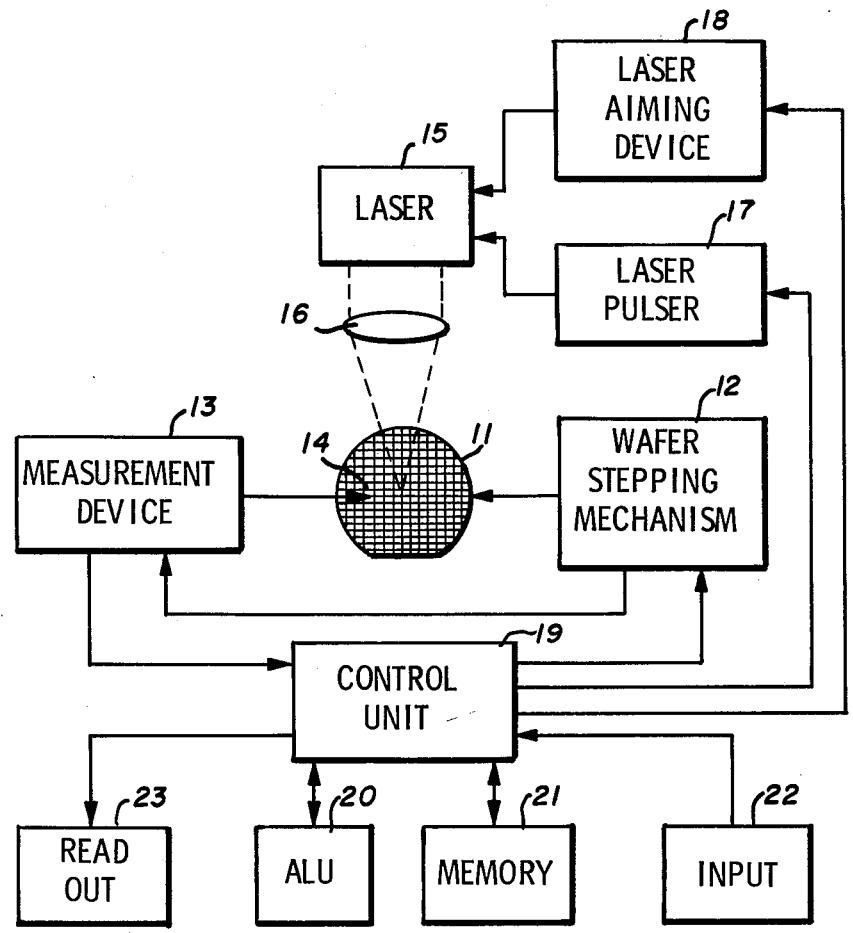
Fig_1
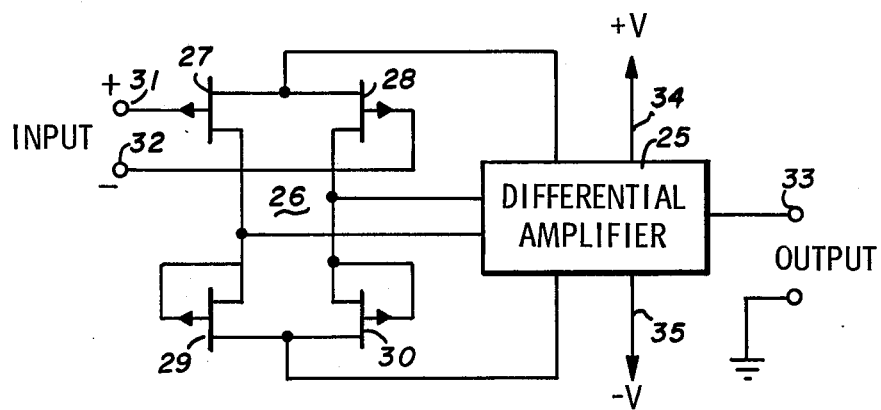
Fig_2

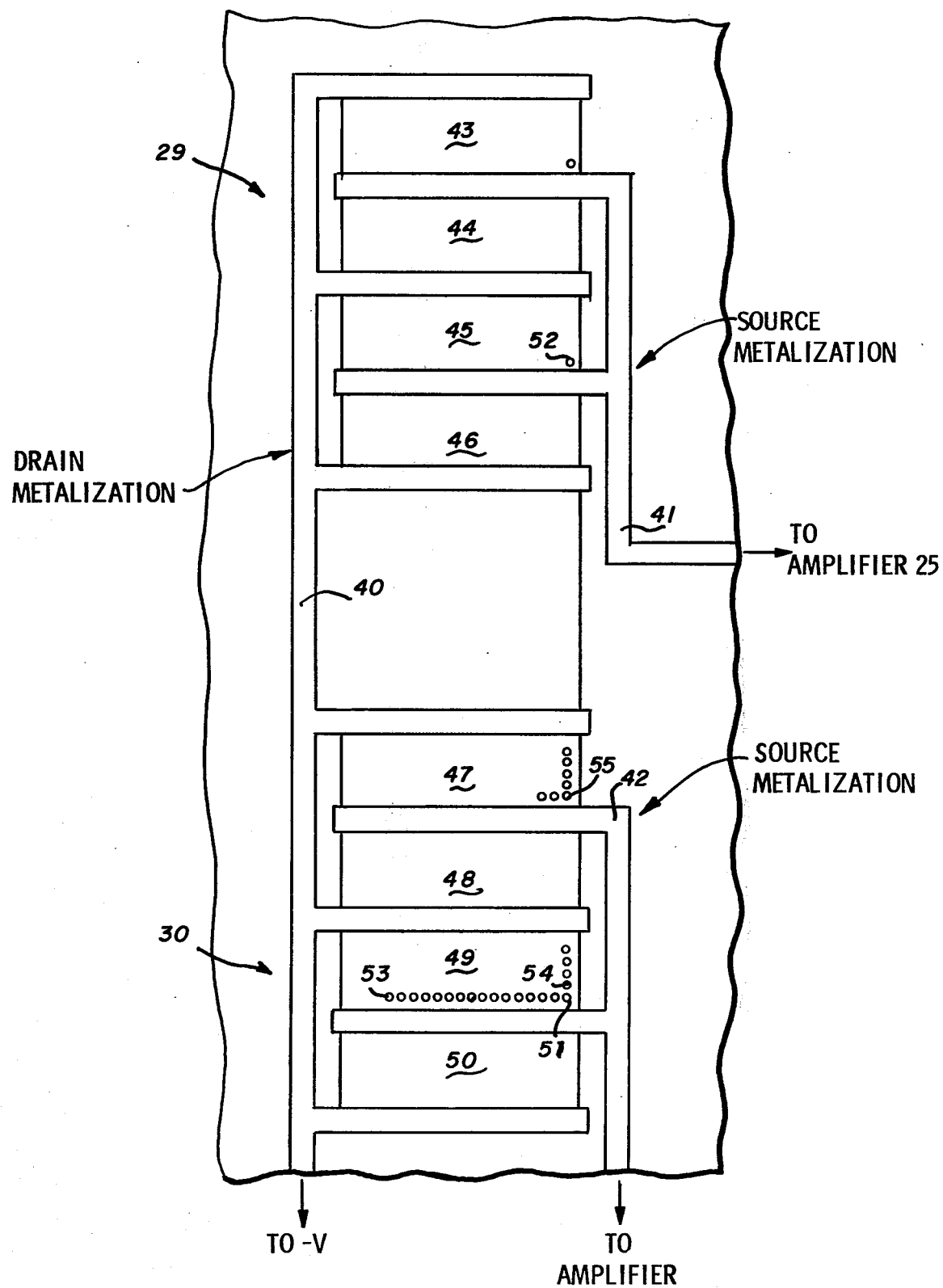
Fig_3

AUTOMATIC CONTROL OF INTEGRATED CIRCUIT TRIMMING

BACKGROUND OF THE INVENTION

Copending application Ser. No. 830,979, filed Sept. 6, 1977, by Robert F. Johnson and assigned to the assignee of the present invention, discloses and claims means for laser trimming active semiconductor devices. In particular, it is shown how a pair of junction field effect transistor (JFET) devices can be laser trimmed so as to balance their performance. This is important because a very useful class of semiconductor monolithic integrated circuit operational amplifiers (op amps) has been developed. In this circuit form, the useful characteristics of JFET devices have been combined with those of bipolar junction transistor (BJT) devices to provide op amps of extremely useful performance. In one instance, a JFET input stage having very high input impedance is used to drive a BJT output stage. Typically, the input stage is biased by JFET devices as shown in U.S. Pat. No. 3,959,733 which issued to James E. Solomon and Ronald W. Russell on May 25, 1976, and is assigned to the assignee of the present invention.

JFET devices are difficult to manufacture to a precise balance and, when used in the above-described balanced circuitry, are often provided with external offset adjustment means. More recently, the above-described laser trimming has been applied and has eliminated the need for external adjustment in many cases. However, the laser trimming operation is tedious and slow, and requires great care in its implementation. It would be highly desirable to perform the trimming on a mass production basis.

SUMMARY OF THE INVENTION

It is an object of the invention to trim integrated circuits to provide a controlled electrical parameter on an automatic basis.

It is a further object of the invention to employ a pulsed laser in a step and repeat operation to trim a succession of circuits in wafer form automatically to control a selected performance characteristic.

These and other objects are achieved by employing the following sequence. A semiconductor wafer, containing a plurality of integrated circuits manufactured therein, is placed in a step and repeat mechanism. A set of probes associated with the mechanism is arrayed to contact the pads on the IC. After contact is made, the circuit is energized and a selected parameter measured. For example, the input circuit offset voltage can be measured, with the polarity and magnitude being noted. The polarity of the offset voltage will indicate which transistor must be reduced in size and a laser associated with the step and repeat machine aimed at a predetermined point on the circuit. The laser is pulsed and translated simultaneously. The number of pulses is predetermined by the offset magnitude and is calculated to reduce it to zero. Under ideal conditions the offset when remeasured will be zero. If it is not zero, or at least not within a specified range, the process of trimming and measuring is repeated until a desired low offset voltage is achieved. Since each cycle of operation will produce a reduction in offset, very low values can quickly be achieved. Once a successful trim is achieved, or it is determined that the circuit cannot be trimmed, the probes are withdrawn from contact with the circuit, and the next circuit stepped into position. This process is repeated until all of the circuits on the wafer have been treated.

BRIEF DESCRIPTION OF THE DRAWING

FIG. 1 is a block diagram of a system useful in practicing the invention;

FIG. 2 is a diagram of the JFET input stage in an op amp; and

FIG. 3 is a fragmentary view of the IC topography showing a pair of the JFET devices of FIG. 2.

DESCRIPTION OF THE INVENTION

In FIG. 1, a block diagram shows the elements of the invention. A semiconductor wafer is shown at 11. This wafer contains a plurality of IC devices which have been fabricated using conventional well known processing. Such wafers can have a 4-inch diameter and may contain, typically, several thousand circuits. Such wafers are generally circular with an orientation flat as shown. Wafers are ordinarily tested in a conventional step and repeat mechanism 12 which can be adjusted to precisely move the wafer in both X and Y directions by predetermined and selectable steps that are related to the circuit spacing. An associated conventional measurement device 13 includes a set of electrical probes 14 that conform to the pads on the IC being tested. Mechanism 12 moves the probe assembly 14, associated with device 13, out of contact with wafer 11 while stepping is being accomplished. Once a particular circuit is stepped into position the probe set is caused to contact the wafer. The probes permit power to be applied to the IC and tests to be made thereon. While not shown, optical observation means are also associated with mechanism 12 for observing the circuit and probe set 14.

In accordance with the invention, a laser 15 is focused by means of lens 16 onto wafer 11. A pulser 17 operates laser 15, and the laser beam is aimed by device 18. The entire system is operated by a control unit 19 which has an input 22 such as a keyboard. The control unit either includes or is connected to an arithmetic logic unit 20, and a memory 21. A readout device 23 provides information on the system as desired. Typically, elements 22 and 23 will be in the form of a computer terminal keyboard and cathode ray tube display. Elements 19-21 will be in the form of a microprocessor.

Laser aiming device 18 is, typically, a mirror system with X and Y drivers under digital control and is, therefore, easily controlled by a microprocessor. The laser pulser 17, being intrinsically digital, is also readily controlled by a microprocessor. Commercially available step and repeat mechanisms for element 12 are digitally controllable and measurement device 13 can include commercially available digitally controlled test devices and power supplies.

FIG. 2 is a partial schematic block diagram of the circuit disclosed in U.S. Pat. No. 3,959,733. This circuit is used, for example, in the LF155 which is a monolithic JFET input operational amplifier available commercially from National Semiconductor Corporation and other suppliers. A differential amplifier 25 is composed mainly of BFT devices, and is driven from a JFET input stage 26 which is made up of a pair of JFET amplifiers 27 and 28, and a pair of JFET constant current connected load devices 29 and 30. The input terminals 31 and 32 are differentially referenced to output terminal 33. The entire circuit is powered from positive and negative potentials applied to lines 34 and 35 respectively and referenced to ground.

One of the important parameters of the circuit is the offset voltage $V_{OS}$ which is defined as the voltage that must be applied between terminals 31 and 32 to produce zero volts (or a particular reference) at terminal 33. Desirably, $V_{OS}$ is zero and a low number denotes circuit excellence. Since it is difficult to manufacture circuits having $V_{OS}$ below about 10mv, it is a common practice to provide on offset correcting capability in amplifier 25. This permits an off-chip device, such as a potentiometer, to act to compensate the circuit to a desirably low $V_{OS}$.

FIG. 3 is a fragmentary topography portion of the circuit of FIG. 2. JFET devices 29 and 30 are shown in detail. The wide metal lines portray the metallization that contacts the source and drain electrodes. The drain electrodes make up metallization 40. The upper drain portion is interdigitated with source metallization 41 to form JFET 29. It can be seen that four channel regions labeled 43-46 are parallel connected to make up a relatively large area structure. Similarly JFET 30 in the lower portion is made up of channel regions 47-50 parallel connected. While not shown, each of the channels 43-50 has a top and bottom gate appropriately connected.

From the connections of FIG. 2, if $V_{OS}$ is positive at the noninverting input 31, it can be seen that JFET 27 conduction should be reduced. This can be accomplished by trimming the size of load JFET 29. Similarly, if $V_{OS}$ is negative at noninverting input 31, it can be seen that the conduction of JFET 28 must be decreased and this can be done by trimming load JFET 30. Clearly, the amount of trimming required is related to the magnitude of $V_{OS}$. However, the trim magnitude is related to the device construction, laser beam size, power and other variables. As a practical matter, the actual trim rate is established on an empirical basis for each microcircuit to be trimmed.

The sequence of trimming, with respect to the drawing, is as follows:

First, a wafer 11 containing a plurality of circuits to be trimmed is mounted in the wafer stepping mechanism 12 and oriented with respect to the stepping action. Probe assembly 14 is then adjusted to contact the appropriate pads on the microcircuit. The following steps will be described in detail, and are all capable of being programmed into the system using ALU 20, and memory 21 in conjunction with control unit 19.

First, power is applied to the microcircuit and $V_{OS}$ measured. The polarity of $V_{OS}$ is used as described above to determine which JFET is to be trimmed, and the magnitude used to compute the amount of trim.

By way of example, a YAG laser operating at about one micron was pulsed at a 5KHz rate using 10 microsecond pulses to give a duty cycle of 5%. When operated at an average power level of about 20 milliwatts (or about 0.4 watt peak) and focused to a beam waist of about 0.0004 inch, the laser produced useful trimming. In operation, the laser was pulsed and translated at a rate that produced one pulse each 0.0002 inch. When employed to trim JFET devices 29 and 30 on LF155 circuits as described above, it was found that the following empirical formula could be used.

$$T_D = (2(V_{OS} + 1.5))/15 \qquad (1)$$

where $T_D$ = Trim distance in mils.
$V_{OS}$ = Offset voltage in millivolts.

This formula will hold for a maximum of $V_{OS}$ of 30 millivolts or 4.2 mils of trim distance which involve 21 laser pulses maximum. The channel shown in FIG. 3 for the LF155 is about 6 mils wide by 1 mil across. Point 51 of FIG. 3 represents the preferred trim start in JFET 30. The equivalent point in JFET 29 is point 52. Point 53 represents the end of the first trim line for a 30mv $V_{OS}$ correction. Points 51 and 53 are well inside the channel width and the resultant line is close to, but clear of the source electrode. If a greater trim range is desired, the laser can be translated to a distance about 0.1 mil above the first line to a point labled 54, and a second trim line or row of pulses applied. In the second row the trim rate is substantially lower than that of equation (1). Five such rows of trim lines involving a span of about 0.5 mil can be applied to channel 49. If even more trim range is desired, channel 47 can be similarly trimmed starting at point 55. In general, it is preferred that trimming be done inside the channel near to the source, and well away from the drain. Clearly other trim patterns can be used.

To continue the process description, after the amount of trim required is computed, the control unit 19 operates pulser 17 and aiming device 18 to produce a trim pattern. Then, the circuit is remeasured. If the $V_{OS}$ after trimming is in specification, the stepping mechanism is directed to proceed to the next circuit. If the $V_{OS}$ after trim is still not within specification, the $V_{OS}$ is again measured and used to specify a trim and which JFET is to be trimmed. A second trim is then commmenced. After trim the circuit is again measured. This sequence is repeated until an in specification measurement is obtained, or a maximum pulse count trim limit reached. In this latter case, the circuit becomes a reject. In either case, the next and subsequent circuits are operated upon until the entire wafer has been treated.

It has been found that this process can produce a high circuit yield from a wafer to a 0.5mv $V_{OS}$ specification. Such a production capability makes off chip compensation unnecessary for practically all circuit applications.

While the above process is applied to a wafer, and such will constitute the most common application, the invention also contemplates treatment of a single circuit as described above. In fact, the invention contemplates the treatment of individual circuit chips alone, mounted, or in combination with others. What has been described is a trimming process for the automatic treatment of an integrated microcircuit to improve its performance.

Clearly, there are alternatives and equivalents to the various elements as taught that will be within the spirit and intent of the invention. It is, therefore, intended that the scope of the invention be limited only by the claims that follow.

I claim:

1. A process for trimming a junction field effect transistor component in a monolithic integrated circuit to obtain a controlled electrical parameter having a desired magnitude in the completed integrated circuit, said process comprising the steps:

energizing said integrated circuit;

measuring a selected parameter to be controlled in said circuit;

determining a trimmable junction field effect transistor in said circuit which, if subjected to radiant energy, would vary the operation of said circuit in a direction that would tend to establish said desired magnitude of said selected parameter;

subjecting the channel region of said junction field effect transistor to a predetermined controlled quantity of radiant energy;

remeasuring said selected parameter; and repeating said subjecting and remeasuring steps until said remeasuring step indicates that said selected parameter is within said desired magnitude.

2. The process of claim 1 wherein said radiant energy is obtained from a pulsed laser.

3. The process of claim 2 wherein said laser is translated with respect to said integrated circuit and a plurality of laser pulses employed in said subjecting step.

4. The process of claim 3 wherein the number of pulses employed in said subjecting step is made proportional to how far said measuring step indicated that said parameter differs from said desired magnitude.

5. The process of claim 4 wherein said laser pulses are focused to a spot small with respect to said channel and located adjacent the source electrode of said transistor.

6. The process of claim 5 wherein said laser pulses produce a series of trim spots translated in a direction parallel to said source electrode.

7. The process of claim 1 wherein said integrated circuit is trimmed while in wafer form.

8. The process of claim 7 wherein said process is practiced sequentially on a succession of integrated circuits on said wafer and including the further steps of:

indexing said wafer in step and repeat fashion;

bringing measurement means into contact with a selected circuit on said wafer prior to said trimming process; and retracting said measurement means from said wafer following said trimming process.

9. The device made by the process of claim 1.

* * * * *